(12) United States Patent
Alberti et al.

(10) Patent No.: US 10,796,918 B2
(45) Date of Patent: *Oct. 6, 2020

(54) INTEGRATED CIRCUITS WITH BACKSIDE METALIZATION AND PRODUCTION METHOD THEREOF

(71) Applicant: STMICROELECTRONICS S.R.L., Agrate Brianza (IT)

(72) Inventors: Alessandra Alberti, Gravina di Catania (IT); Paolo Badala', Acireale (IT); Antonello Santangelo, Belpasso (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 15/640,203

(22) Filed: Jun. 30, 2017

(65) Prior Publication Data
US 2017/0301548 A1 Oct. 19, 2017

Related U.S. Application Data

(63) Continuation of application No. 13/281,370, filed on Oct. 25, 2011, now Pat. No. 9,728,411.

(30) Foreign Application Priority Data

Oct. 25, 2010 (IT) .............. MI10A001963

(51) Int. Cl.
*H01L 23/498* (2006.01)
*H01L 23/495* (2006.01)
(Continued)

(52) U.S. Cl.
CPC .. *H01L 21/28518* (2013.01); *H01L 21/28568* (2013.01); *H01L 23/4827* (2013.01);
(Continued)

(58) Field of Classification Search
CPC . H01L 2924/00014; H01L 2924/01028; H01L 2224/29155; H01L 2224/05155; H01L 2224/04042; H01L 2224/05655
See application file for complete search history.

(56) References Cited

U.S. PATENT DOCUMENTS 3,985,515 A 10/1976 Greeson et al.
4,042,951 A 8/1977 Robinson et al.
(Continued)

FOREIGN PATENT DOCUMENTS

WO 2008/050251 A1 5/2008

*Primary Examiner* — Bradley Smith
*Assistant Examiner* — David J Goodwin
(74) *Attorney, Agent, or Firm* — Seed Intellectual Property Law Group LLP

(57) ABSTRACT

An embodiment of an integrated device, including a chip of semiconductor material wherein an integrated circuit is integrated, is proposed; the integrated device includes a set of contact terminals for contacting the integrated circuit. At least one contact terminal of said set of contact terminals includes a contact layer of metal material being suitable to be directly coupled mechanically to an element external to the chip, and a coupling element for improving an electrical and/or mechanical coupling between the contact layer and the chip. The coupling element includes a coupling layer being formed by a combination between the metal material of the contact layer and the semiconductor material of the chip, with the coupling layer that is directly coupled to the chip and to the contact layer.

19 Claims, 7 Drawing Sheets

(51) Int. Cl.
  *H01L 21/285* (2006.01)
  *H01L 23/482* (2006.01)
  *H01L 23/00* (2006.01)

(52) U.S. Cl.
  CPC .............. *H01L 24/03* (2013.01); *H01L 24/05* (2013.01); *H01L 24/06* (2013.01); *H01L 24/94* (2013.01); *H01L 2224/0345* (2013.01); *H01L 2224/0401* (2013.01); *H01L 2224/04026* (2013.01); *H01L 2224/04042* (2013.01); *H01L 2224/05155* (2013.01); *H01L 2224/05639* (2013.01); *H01L 2224/05644* (2013.01); *H01L 2224/05655* (2013.01); *H01L 2224/06181* (2013.01); *H01L 2224/94* (2013.01); *H01L 2924/01014* (2013.01); *H01L 2924/0132* (2013.01); *H01L 2924/01322* (2013.01); *H01L 2924/10253* (2013.01); *H01L 2924/12032* (2013.01); *H01L 2924/14* (2013.01)

(56) References Cited

U.S. PATENT DOCUMENTS

| | | | |
|---|---|---|---|
| 4,554,045 A | 11/1985 | Bean | |
| 4,597,029 A | 6/1986 | Kucharek et al. | |
| 5,217,922 A * | 6/1993 | Akasaki | H01L 21/50 228/180.22 |
| 5,360,765 A | 11/1994 | Kondo et al. | |
| 6,413,851 B1 | 7/2002 | Chow et al. | |
| 6,426,248 B2 | 7/2002 | Francis et al. | |
| 6,806,172 B1 | 10/2004 | Woo et al. | |
| 8,722,528 B2 * | 5/2014 | Gruenhagen | H01L 21/6835 257/502 |
| 2001/0006409 A1 | 7/2001 | Lee | |
| 2002/0019084 A1 | 2/2002 | Francis et al. | |
| 2003/0029705 A1 | 2/2003 | Qiu et al. | |
| 2003/0029715 A1 | 2/2003 | Yu et al. | |
| 2005/0253205 A1 | 11/2005 | Kawamura | |
| 2006/0114948 A1 | 6/2006 | Lo et al. | |
| 2006/0115948 A1 | 6/2006 | Tokunaga | |
| 2008/0185618 A1 | 8/2008 | Chu et al. | |
| 2008/0230911 A1 | 9/2008 | Li | |
| 2008/0242029 A1 * | 10/2008 | Wu | H01L 21/743 438/270 |
| 2009/0297774 A1 | 12/2009 | Chaudhari | |
| 2010/0087061 A1 | 4/2010 | Mai et al. | |
| 2011/0006409 A1 * | 1/2011 | Gruenhagen | H01L 24/05 257/666 |
| 2011/0124146 A1 | 5/2011 | Pitera et al. | |
| 2011/0143495 A1 | 6/2011 | Pitera et al. | |
| 2012/0080686 A1 | 4/2012 | Madder et al. | |

\* cited by examiner

INTEGRATED CIRCUITS WITH BACKSIDE METALIZATION AND PRODUCTION METHOD THEREOF

PRIORITY CLAIM

The instant application claims priority to Italian Patent Application No. MI2010A001963, filed Oct. 25, 2010, which application is incorporated herein by reference in its entirety.

TECHNICAL FIELD

One or more embodiments generally relate to integrated devices. More specifically, one or more embodiments relate to terminals of integrated devices.

BACKGROUND

Typically, each integrated device (for example, an integrated electronic device) includes a chip of semiconductor material wherein a corresponding circuit (e.g., an electronic circuit) is integrated for implementing specific functionalities of the integrated device. In particular, a region of the chip is usually used as a substrate of the integrated device, whereas the integrated circuit is formed within at least one functional layer of the chip extending above the substrate (e.g., one or more epitaxial layers); therefore, contact terminals of the integrated circuit are typically made through suitable conductive layers on a front surface of the chip (commonly denoted as front contact terminals), so as to contact the epitaxial layer in which the integrated circuit is formed.

However, some integrated circuits also need contact terminals being formed on a rear surface of the chip (commonly denoted as rear contact terminals), so as to directly contact the substrate. This is the case, for example, for integrated circuits including MOS or BJT transistors for power applications; the latter ones, in fact, have a vertical structure in which a corresponding drain or collector terminal is contacted through the substrate. Moreover, in certain applications, integrated circuits may require rear contact terminals so as to be able to conduct away parasitic leakage currents being originated within the substrate.

In order to form such rear contact terminals, one or more metal layers are typically formed on the rear surface of the substrate, which metal layers are usually generically referred to as backside metallization.

As it is known, backside metallization, although relatively widely used, has some drawbacks that may impair an optimal operation of the corresponding integrated device.

In fact, the substrate and the backside metallization may create a semiconductor-metal junction that forms a corresponding Schottky diode; in order to make such junction ohmic and with a low contact specific resistance (or contact resistivity) (e.g., of the order of several tens of $\mu\Omega \ast cm^2$), the substrate is typically formed with a high dopant concentration (e.g., greater than $10^{18}$ cm$^{-3}$); in this way, a potential barrier at the interface of the junction is reduced in thickness, thereby facilitating its crossing, via a tunnel effect, by electrical charges. However, an over-doped substrate, in addition to increasing uniformity issues in dopant concentrations between central and side portions of a wafer wherein several integrated circuits are normally formed, may also make difficult the formation of less-doped thin epitaxial layers thereon; moreover, during annealing procedures (e.g., being used to promote a proper reorganization of the reticular structure and a correct and uniform doping of the substrate), the substrate may consume the epitaxial layer above it, because of an excessive dopant concentration gradient therebetween.

For this reason, a different approach is that of making the backside metallization in a material with such chemical and physical features that allow lowering the contact specific resistance, without substantially needing to increase the dopant concentration within the substrate, assuring limited silicon consumption. However, such material may also have to meet mechanical requirements of good adhesion to the substrate and good solderability with elements external to the integrated device—for example, pins of a package thereof.

For this reason, the solutions being currently used for combining such (electrical and mechanical) requirements provide a composite structure of the backside metallization including different metal layers, each one of which is intended to meet a specific requirement.

For example, in a conventional solution, the backside metallization includes a chromium (or titanium) layer being deposited on the substrate to ensure good adhesion or low contact specific resistance, a nickel layer being deposited on the chromium layer to ensure good solderability, and a gold layer being deposited on the nickel layer for protecting the latter against external contaminations and oxidations, and for improving the solderability of solder elements during welding operations. However, a backside metallization thus implemented may have some drawbacks, mainly due to the need of recurring to trade-off values of dopant concentration within the substrate; in particular, in conditions of relatively high substrate resistivity (e.g., greater than 6 m$\Omega$*cm, as a result of low dopant concentrations therein), the substrate-chromium layer junction has good adhesion but a high contact specific resistance, whereas in conditions of relatively low substrate resistivity (e.g., lower than 6 m$\Omega$*cm, as a result of high dopant concentrations), the substrate-chromium layer junction has a low contact specific resistance, but a worse adhesion. Since the trade-off values being chosen for the dopant concentration within the substrate vary according to the performance to be obtained for the integrated device, different variants of the production process may have to be provided; this may imply a relevant logistic and economic effort by a manufacturer of the integrated device, which may imply an increase in the production costs thereof.

In another solution described in WO-A-2008/050251, which is incorporated by reference, the backside metallization includes a gold-silicon eutectic alloy to achieve both a low contact specific resistance and good adhesion. In particular, the eutectic alloy layer is obtained by first depositing a gold layer on the substrate, and then making an appropriate heat treatment, after which the eutectic alloy is placed between a residual gold layer (not involved in the making of the eutectic alloy) and the substrate. Moreover, the backside metallization according to such solution includes a silver layer being deposited on the residual gold layer (for preventing subsequent depositions operations from damaging the eutectic alloy layer), a nickel layer being deposited on the silver layer (for providing good solderability), and a gold (or silver) layer on the nickel layer for protecting the same. Anyway, such a type of backside metallization may involve a significant production complexity and relatively high costs.

SUMMARY

An embodiment is based on the idea of making a coupling layer with the chip directly from the metal layer being used for making the connection to the external elements.

An embodiment is an integrated device including a chip of semiconductor material wherein an integrated circuit is integrated; the integrated device includes a set of contact terminals for contacting the integrated circuit. At least one contact terminal of said set of contact terminals (for example, a rear contact terminal) includes a contact layer of metal material (for example, nickel) being suitable to be directly coupled mechanically (for example, soldered—alone or with the addition of another material that improves its wettability) to an element external to the chip (for example, a pin of a corresponding package), and a coupling element for improving an electrical coupling (for example, a contact specific resistance) and/or mechanical coupling (for example, an adhesion) between the contact layer and the chip. In an embodiment, the coupling element includes a coupling layer being formed by a combination between the metal material of the contact layer and the semiconductor material of the chip, with the coupling layer that is directly coupled to the chip and to the contact layer (for example, an alloy thereof, a chemical compound thereof, and/or an aggregate including at least one chemical compound thereof).

Another embodiment is a corresponding production method of an electronic device.

BRIEF DESCRIPTION OF THE DRAWINGS

One or more embodiments, as well as further features and the advantages thereof, will be best understood with reference to the following detailed description, given purely by way of a non-restrictive indication, to be read in conjunction with the accompanying drawings (wherein corresponding elements are denoted with equal or similar references, and their explanation is not repeated for the sake of exposition brevity). In this respect, it is understood that the figures are not necessarily drawn to scale (with some details that may be exaggerated and/or simplified) and that, unless otherwise indicated, they are simply used to conceptually illustrate the described structures and procedures. In particular.

DETAILED DESCRIPTION

Figure 1:
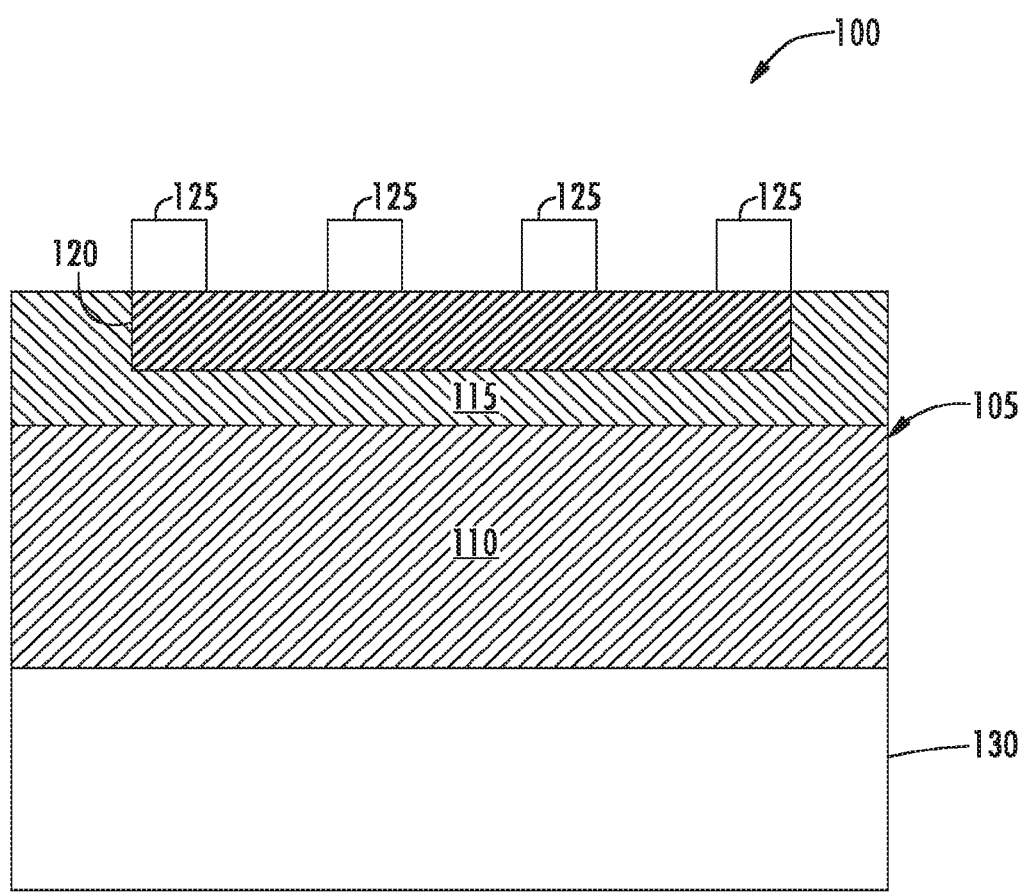
FIG. 1 schematically shows an integrated device wherein an embodiment may be used.

With particular reference to FIG. 1, it schematically shows an integrated device 100 (e.g., an integrated electronic device) wherein an embodiment may be used. The integrated device 100 is formed in a chip 105 of semiconductor material (e.g. silicon); in particular, the chip 105 includes a support substrate 110 on which at least one functional layer 115 (e.g., one or more epitaxial layers) is formed. An integrated circuit 120 (e.g., an integrated electronic circuit) is formed within the functional layer 115 for implementing specific functionalities of the integrated device 100; the integrated circuit 120, schematically depicted as a generic functional block for simplicity, may include active components (such as transistors) and/or passive components (such as resistors and/or capacitors). The integrated device 100 also includes contact terminals for coupling (mechanically, e.g., by soldering, and electrically) the integrated circuit 120 to elements external to the integrated device 100—for example, pins of a corresponding package or terminals of another integrated circuit, not shown in the figure. In particular, such contact terminals include front contact terminals 125 (only four shown in the exemplary illustrated embodiment) being formed on a front surface of the chip 105 (defined by a free surface of the functional layer 115), and a rear contact terminal (or backside metallization) 130 being formed on a rear surface of the chip 105 (defined by a free surface of the substrate 110); for example, the backside metallization 130 may be used for contacting drain (or collector) terminals of power transistors having a vertical structure, or for collecting, through the substrate 110 and the functional layer 115, parasitic leakage currents being possibly originated within the integrated circuit 120.

Turning now to FIG. 2A-2D, they schematically show, in front view, some steps of a production process of the integrated device of FIG. 1 according to an embodiment, with particular attention to aspects relating to the making of its backside metallization.

Figure 2A:
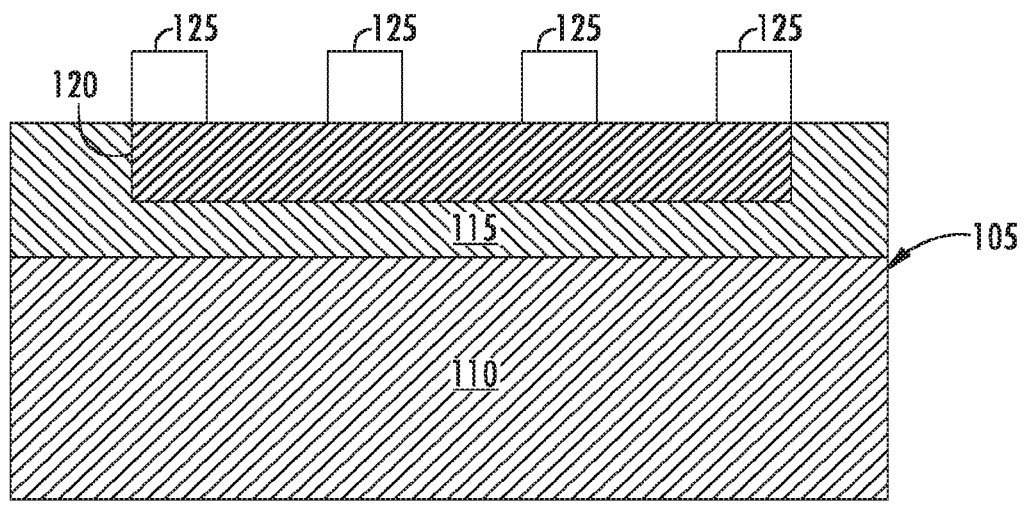
FIG. 2A-2D schematically show, in front view, some steps of a production process of the integrated device of FIG. 1 according to an embodiment.

Starting from FIG. 2A, it schematically shows the integrated device at an intermediate step of the corresponding production process, wherein the integrated circuit 120 has already been formed within the functional layer 115, and the front contact terminals 125 have already been formed on the chip 105.

Figure 2B:
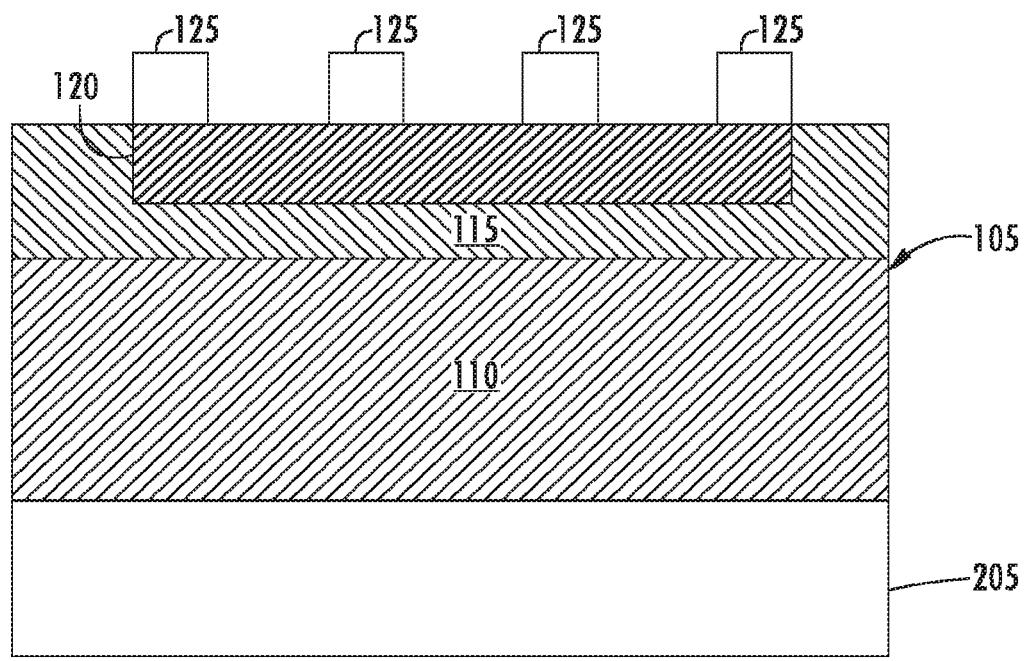

As visible in FIG. 2B, a precursor layer 205 of metal material, e.g., nickel, is formed under the chip 105. In particular, the precursor layer 205 may be obtained by any deposition process, for example a low rate deposition process (such as a PVD, "Physical Vapor Deposition", process).

At this point, the structure so far obtained is subject to an annealing procedure, including a heating treatment step at relatively low temperature (e.g., lower than 400° C.), followed by cooling; in an embodiment, the characteristics (e.g., time, rate) of the cooling have little to no impact on the silicide formation. In particular, the heating treatment step is implemented by inserting the structure into a suitable heating element (not shown in the figure); the latter may be, for example, an ordinary RTP ("Rapid Thermal Processing") oven, which is able to subject the structure to a desired process temperature in very quick times (e.g., of the order of a few seconds).

Figure 2C:
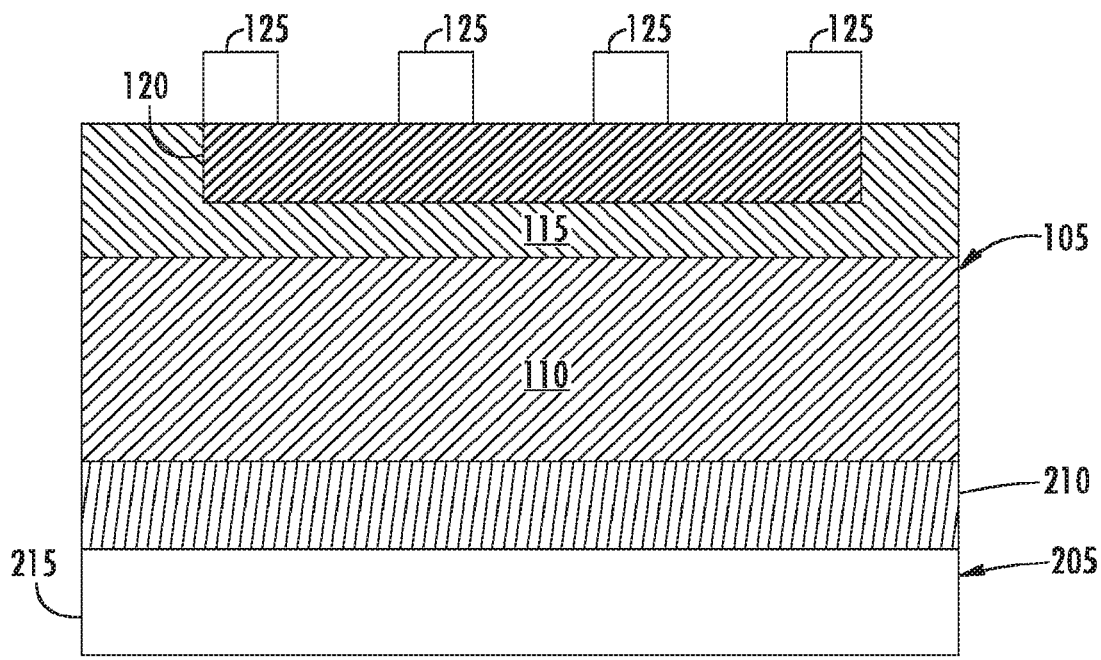

After the annealing procedure, as visible in FIG. 2C, a layer 210 is formed that is obtained by a combination of part of the nickel of the precursor layer 205 and a part of the silicon of the substrate 110. Depending on the process parameters being used, such combination may lead to an alloy (i.e., a solid solution physically homogeneous but chemically heterogeneous), a chemical compound (i.e., a substance formed by elements with a fixed stoichiometric ratio), or an aggregate of chemical compounds that are insoluble between each other and that coexist in the solid phase. But in an embodiment, the nickel reacts with the silicon such that the resulting substance is a chemical compound or an aggregate of chemical compounds. In particular, in an embodiment, during the annealing process respective regions mutually facing the substrate 110 and the precursor layer 205 combine with each other, thereby forming an aggregate of silicide-like compounds (whose stoichiometric ratios depend, for example, on temperature and/or duration of the annealing procedure). For example, the structure is subject to a heating treatment step at a temperature of about 200° C. for a period of about 10 seconds; in this way, a layer 210 is obtained that includes silicide-like compounds mainly in the form of NiSi and in minority quantity in the form of $Ni_2Si$, and that has a thickness of about 8 nm (by consuming about 4 nm of the precursor layer 205).

As a consequence, at the end of the annealing procedure a large (not combined) residual portion 215 of the precursor layer remains on the layer 210. Such residual portion 215, being of, e.g., nickel, i.e. a material having good solderability properties, is used to be mechanically coupled directly to the external elements (not visible in the figure) of the integrated device—for which in the following it is denoted as contact layer 215. The layer 210, instead, thanks to its chemical and physical properties, improves an electrical and mechanical coupling with the substrate 110 (or in general, with the chip 105)—for which it is denoted as coupling layer 210; in particular, the coupling layer 210 ensures a good adhesion to the substrate 110, and a low contact specific resistance.

Figure 2D:
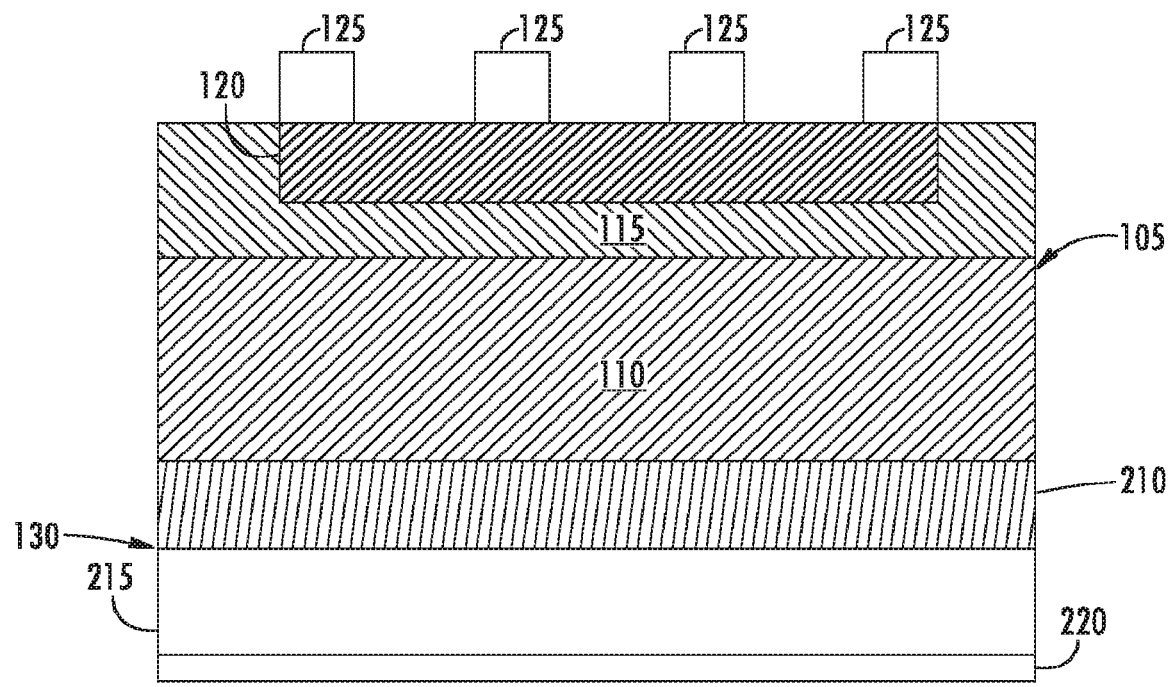

The production process continues to FIG. 2D, wherein a gold layer 220 is deposited on the contact layer 215 to protect the latter against external contaminations and oxidations, and to improve the wettability of solder elements during subsequent soldering operations (not shown)—for which in the following it is referred to as coating layer 220. In this way, the coupling layer 210, the contact layer 215, and the coating layer 220 as a whole form the backside metallization 130.

The described embodiment may be advantageous since it does not need to recur to variable values of dopant concentration within the substrate in order to obtain trade-off solutions between good adhesion and low contact specific resistance.

In particular, the described embodiment allows making the coupling layer 210 by using the same material being used for soldering the backside metallization 130 to the external elements (or for other mechanical coupling operations). This implies a considerable degree of simplification of the process of formation of the backside metallization 130 with respect to conventional solutions t; in fact, the described embodiment does not need any intermediate layer between the coupling layer 210 and the contact layer 215.

Moreover, the described embodiment involves the execution of a few additional steps, each one of which may be achieved by exploiting techniques or processes already being used for the formation of the functional layer 115, of the integrated circuit 120 and/or of its front contact terminals 125. This involves a significant logistic simplicity by a manufacturer of the integrated device, which implies a cost reduction of the production process, and hence of the integrated device.

As a further improvement, in an embodiment, the annealing procedure is performed before or during the deposition procedure of the precursor layer; for example, such result is achieved by a heating element with which modern PVD apparati are typically equipped.

In an alternative embodiment, the step of depositing the precursor layer on the substrate is preceded by an in-situ sputter-etch operation with ions of inert gas (e.g., argon ions $Ar^+$), hereinafter shortly denoted as ionic sputtering; in this way, the substrate is, at least superficially, cleaned from any possible contaminant agents present on it that might affect a good quality of the production process. Moreover, the ionic sputtering also has the effect of increasing the substrate temperature to a value such that, approximately as soon as the precursor layer is deposited on it, nickel and silicon combine together approximately immediately and effectively to form the corresponding coupling layer (without the need for any subsequent annealing procedure). In this way, the resulting coupling layer, being obtained approximately simultaneously to the deposition of the precursor layer in a clean and controlled environment, and without extraction in atmosphere, has a structure with a relatively low content of contaminant agents. Moreover, the use of such a procedure may entail the use of a lower number of equipment, with consequent advantage in terms of manufacturing simplicity and costs.

Figure 3A:
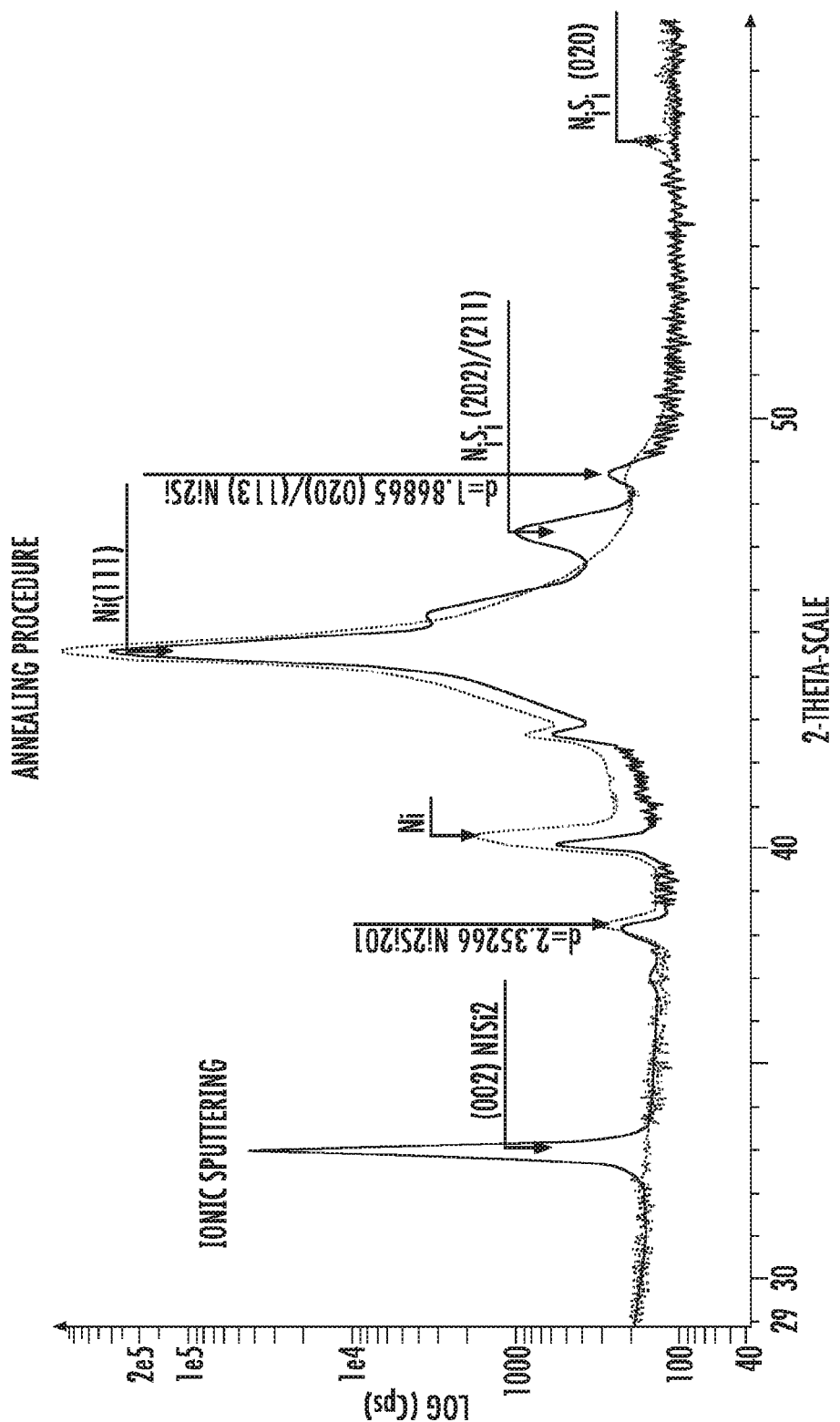
FIGS. 3A-3B are quoted diffractograms comparatively showing the composition of a coupling layer being obtained by a production process according to different embodiments.
Figure 3B:
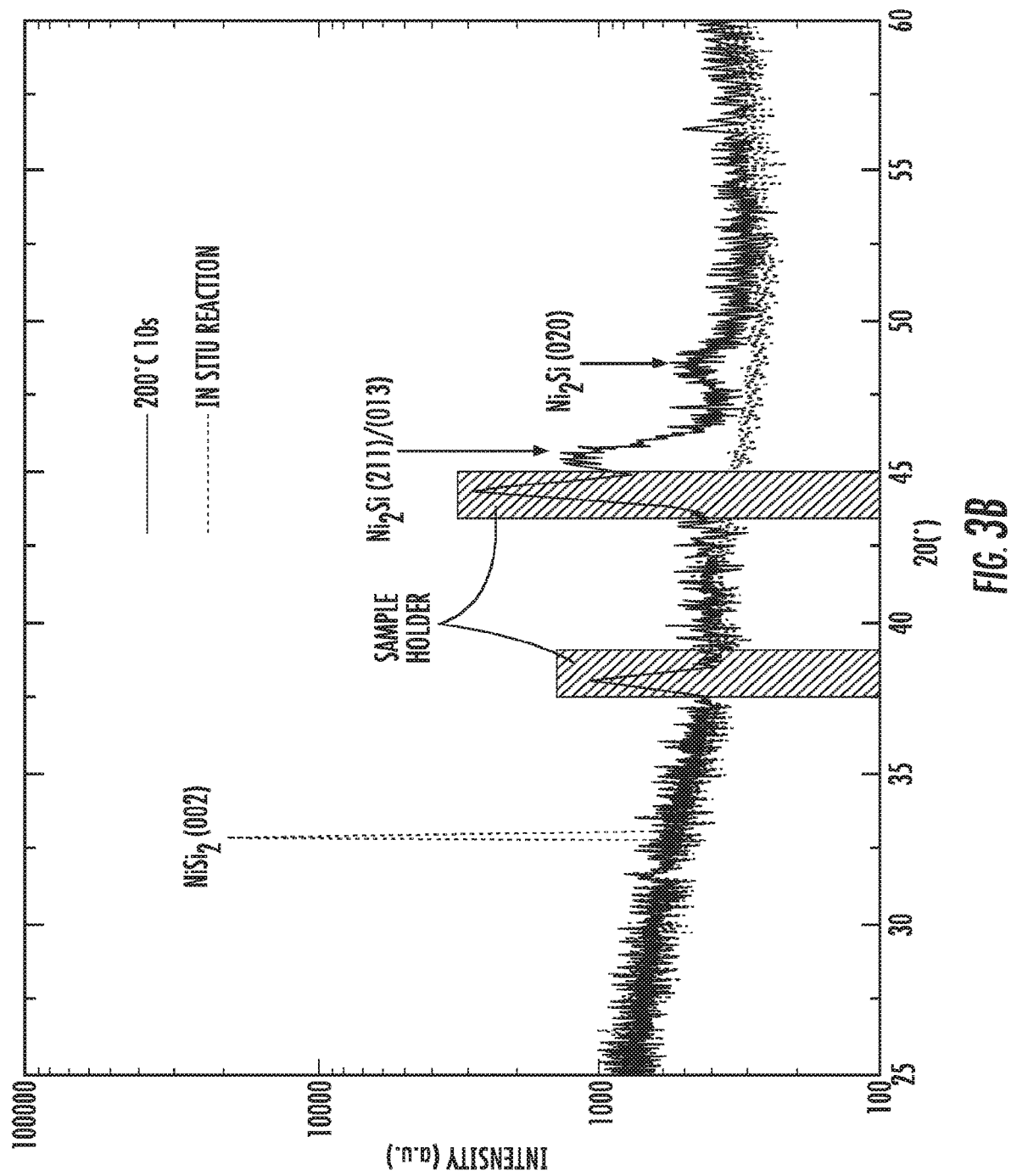

In FIGS. 3A-3B there are shown quoted diffractograms showing the composition, obtained by X-ray analysis using radiant X-rays at an incidence angle of ~0.5°, of the silicides within the coupling layer being obtained both by the annealing procedure and by the ionic sputtering operation. In particular, as visible in such figures, the composition of the coupling layer changes depending on whether it is obtained through the annealing process or the ionic sputtering operation. In the first case, a quite homogeneous structure of the coupling layer is obtained, and includes a prevalence of silicide-like compounds in the form of NiSi, and, in minority amount, in the form of $Ni_2Si$; in the second case, instead, a less homogeneous structure is obtained including NiSi, with relatively high inclusions of $NiSi_2$.

From FIGS. 3A-3B it may also be noticed that during the formation process of the coupling layers (i.e., both that obtained by the annealing procedure and that obtained by the ionic sputtering operation), only a small percentage of the nickel precursor layer has been used for obtaining the coupling layer (in the example at issue, about 20 nm out of about 440 nm, corresponding to about 5% of the deposited precursor layer). In this way, sufficient amounts of uncombined nickel (as visible in the same diffractograms) are available to ensure a good quality of the subsequent soldering process.

Figure 4:
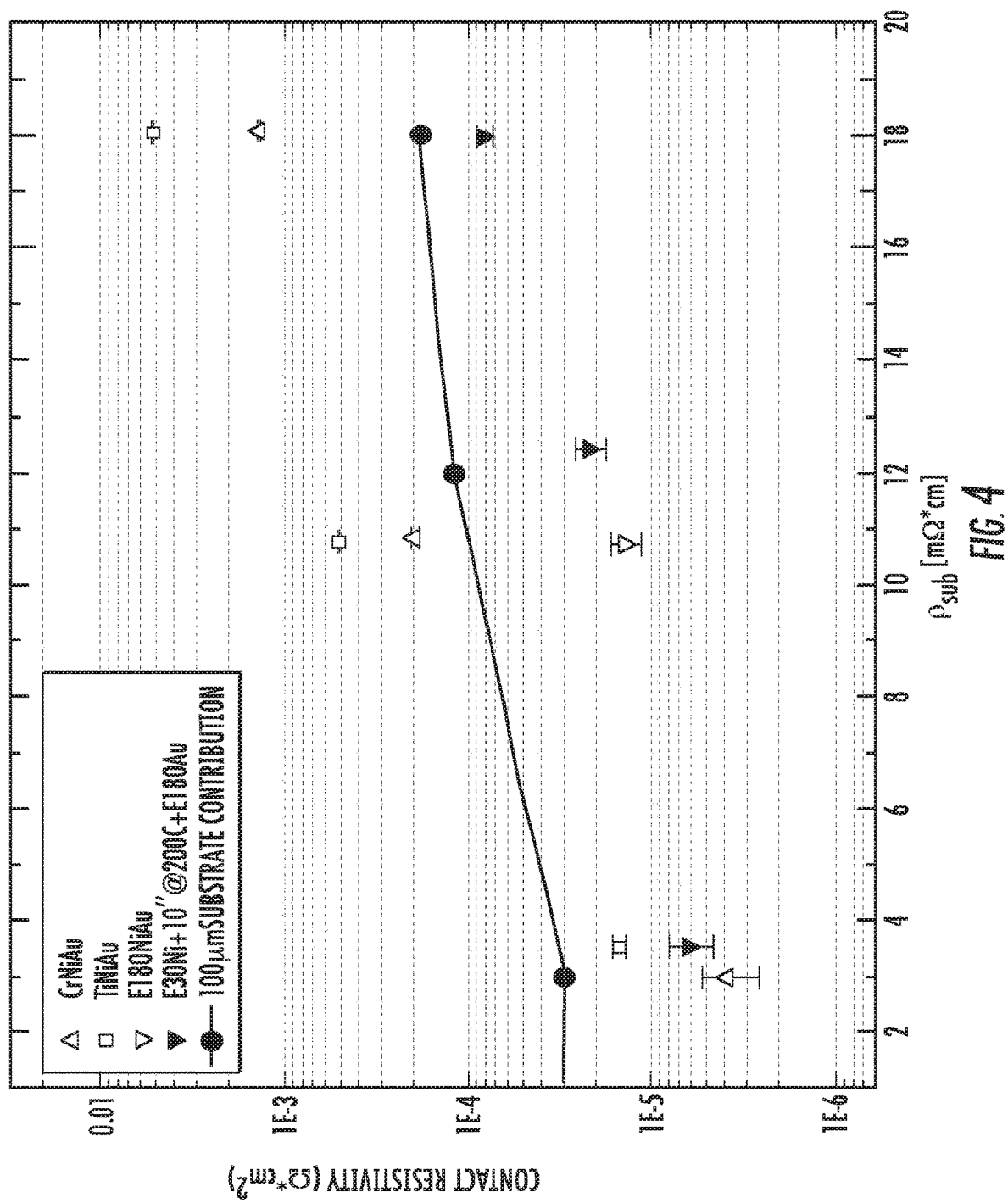
FIG. 4 shows a comparative quoted diagram of the value of contact specific resistance as a function of substrate resistivity between conventional solutions and embodiments.

In FIG. 4 there is shown a comparative quoted diagram of the value of contact specific resistance (in ordinate) as a function of the substrate resistivity (in abscissa), wherein the backside metallization being obtained through the annealing procedure is denoted by the reference E30Ni+10"@200C+E180Au, whereas the backside metallization being obtained through the ionic sputtering operation is denoted by the notation E180NiAu. The contact resistivity has, for both the embodiments above described, lower values than those obtained for backside metallizations being formed by using multilayer structures including chromium or titanium (such as those described in the introductory part of the present description); in this respect, reference is made again to FIG. 4, where in the quoted diagram there are also provided the values of contact specific resistance for the backside metallization including chromium and titanium (denoted by the notations CrNiAu and TiNiAu, respectively).

Figure 5:
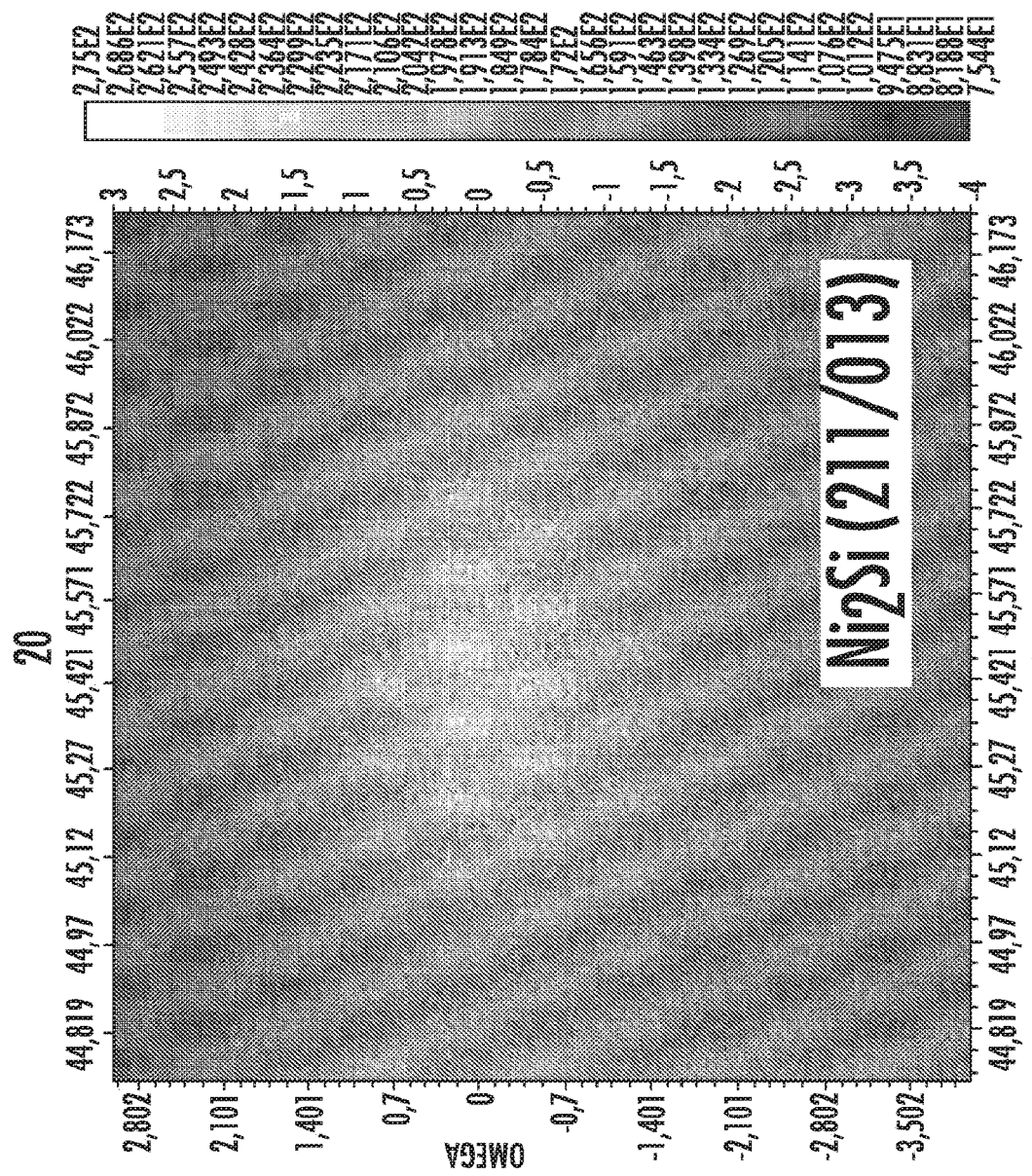
FIG. 5 shows a diagram indicating that, according to an embodiment, the majority of the Nickel is not consumed due to the chemical reaction with Silicon.

FIG. 5 shows a diagram indicating that, according to an embodiment, the majority of the Nickel is not consumed due to the chemical reaction with Silicon.

Although one or more embodiments have been described with a certain degree of particularity, it is understood that various omissions, substitutions and changes in the form and details as well as other embodiments are possible. In particular, different embodiments may even be practiced without the specific details (such as the numeric examples) set forth in the preceding description for providing a more thorough understanding thereof; on the contrary, well known features may have been omitted or simplified in order not to obscure the description with unnecessary particulars. Moreover, it is expressly intended that specific elements and/or method steps described in connection with any disclosed embodiment may be incorporated in any other embodiment as a matter of general design choice.

For example, similar considerations apply if the integrated device has a different structure or includes equivalent components (either separated from each other or combined together, in whole or in part); for example, the backside metallization may have any shape and/or size. In particular, the backside metallization may cover the whole rear surface of the chip, or it may be in the form of different pads (each one for contacting a corresponding or a same pin or any other external element) for particular and specific soldering (or generally contacting) requirements.

Although an embodiment is focused on the backside metallization, it is understood that the same may also be applied for at least one of the front contact terminals of the integrated circuit.

Additionally or alternatively to electrical contact function, the backside metallization may be used as a heat-sink of the integrated device, in order to dissipate the heat generated during its operation. In this respect, it may be possible to provide some variations of the backside metallization in order to ensure thermal performance being appropriate for the application (such as, for example, used material, size, shape, colour, placement, orientation and making and/or assembly modalities).

The contact layer may contribute to the mechanical coupling of the backside metallization in any other way (for example, by soldering or gluing to corresponding pins in wire-bonding, flip-chip technology, and the like). In case of coupling through gluing, the external element to which the contact layer is directly coupled may include, for example, a conductive terminal with an adhesive surface (e.g., obtained by applying a conductive glue or other appropriate material on it).

The combination that gives rise to the coupling layer may include any alloy, including eutectic alloy (i.e., having features proving a single melting point, unlike the classic alloys that typically have a melting range), any single chemical compound, any aggregate of two or more compounds, or any other mixture thereof. In particular, the nature of such combination, as well as characteristics and chemical and physical properties thereof (such as melting point, hardness, etc.) may be chosen, during the design phase, according to technological and economic considerations.

The same considerations may apply if the precursor layer is of a different conductive material, but still suitable for making a mechanically and/or electrically effective coupling layer and a proper contact layer.

The coating layer may also be omitted since it is not necessary; for example, in some applications that are expected to ensure good characteristics in terms of value for money, the external contacts (such as package pins) may be glued directly on the contact layer (however, nothing prevents from making the gluing on the coating layer). Moreover, the coating layer may cover the contact layer only partly, such as, for example, in applications wherein the soldering does not cover entirely the contact layer (whose exposed portions, if uncovered, might be damaged).

Moreover, the coating layer, if provided, may be formed from any other material, such as silver, or it may include a multilayer structure including gold, silver and/or other materials that allow ensuring efficient wetting/gluing properties in case of soldering/gluing to the external elements.

Moreover, an embodiment lends itself to be implemented through an equivalent method (by using similar steps, removing some steps as being not essential, or adding further optional steps); moreover, the steps may be performed in different order, concurrently, or in an interleaved way (at least partly).

Although the making of the backside metallization has been described as following the making of the integrated circuit (and particularly of its functional terminals), the described method steps may be usefully performed during the formation of the integrated circuit, for example, at least partly n parallel by exploiting common, analogous, or similar process steps.

The values of above for temperature and duration of the annealing process should not be construed restrictively, since they are typically chosen in the design stage, according to technical and economic considerations.

Alternatively, it may be possible to use techniques that provide for depositing the precursor layer on the substrate at a high deposition rate; in this way, the high deposition rate involves an increase of the substrate temperature together with the deposition of the precursor layer.

In any case, the possibility of performing such annealing procedure regardless of the deposition process (also ex-situ) is not excluded.

Nothing prevents from executing the ionic sputtering of the substrate with other inert gases (e.g., helium, neon, krypton, xenon, radon, ununoctium). In addition, the ionic sputtering process may still be followed by another heating treatment (for example, through RTP furnace or heating element of the PVD apparatus), in order to improve the mechanical properties of the coupling layer.

The design of the integrated circuit may also be created in a programming language; moreover, if the designer does not manufacture the electronic devices or the masks, the design may be transmitted by physical means to others. In any case, the resulting integrated circuit may be distributed by its manufacturer in raw wafer form, as a bare die, or in packages. Moreover, the proposed structure may be integrated with other circuits in the same chip, or it may be mounted in intermediate products (such as mother boards) and coupled with one or more other chips (e.g., a controller such as a processor). In any case, the integrated circuit may be suitable to be used in complex systems (such as automotive applications or microcontrollers).

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A device, comprising:
a substrate having a first surface and a second surface;
an integrated circuit structure extending into the substrate from the first surface;
a plurality of first contact terminals coupled to the integrated circuit structure and extending from the first surface of the substrate;
a second contact terminal consisting of a single material on the second surface of the substrate, the second contact terminal having a width that is greater than a width of the integrated circuit structure; and a coupling layer in direct contact with the second surface of the substrate and in direct contact with the second contact terminal, the coupling layer including a combination of the single material of the second contact terminal and a material of the substrate and having a homogenous aggregate of first and second silicide-like compounds each having a stoichiometric ratio different from each other and consisting essentially of NiSi as a majority quantity and $Ni_2Si$ as a minority quantity and being insoluble to each other and coexisting in the solid phase, wherein a contact resistivity of the coupling layer and the second contact terminal is above $1\times10^{-5.4}$ and less than $1\times10^{-4.3}$ ohms*cm² and the substrate has a resistivity between 3.5 and 18.0 mohms*cm.

2. The device of claim 1, further comprising a coating layer on the second contact terminal.

3. The device of claim 2 wherein the coating layer is in direct contact with the second contact terminal.

4. The device of claim 2 wherein the coating layer includes gold and the coupling layer includes nickel.

5. The device of claim 1 wherein the coupling layer includes nickel.

6. The device of claim 1 wherein the second contact terminal consists of nickel.

7. A device, comprising:
a chip that includes:
a substrate having a first surface and a second surface;
a first layer on the first surface of the substrate;
an integrated circuit in the first layer;
a plurality of first contacts extending from the integrated circuit;
a first conductive layer on the second surface of the substrate, the first conductive layer including a first portion and a second portion that consists of a single metal material, the first portion including a combination of the single metal material of the second portion and a material of the substrate and having a homogenous aggregate of first and second silicide-like compounds each having a stoichiometric ratio different from each other and consisting essentially of NiSi as a majority quantity and $Ni_2Si$ as a minority quantity and being insoluble to each other and coexisting in the solid phase; and
a second conductive layer on the second portion of the first conductive layer, wherein a contact resistivity of the first portion and the second portion of the first conductive layer is above $1\times10^{-5.4}$ and less than $1\times10^{-4.3}$ ohms*cm² and the substrate has a resistivity between 3.5 and 18.0 mohms*cm.

8. The device of claim 7 wherein the chip includes exterior edges, the integrated circuit having exterior edges that are spaced from the exterior edges of the chip.

9. The device of claim 8 wherein the first conductive layer and the second conductive layer have exterior edges that correspond to the exterior edges of the chip.

10. The device of claim 7 wherein the metal material of the second portion of the first conductive layer is nickel and the second conductive layer includes gold.

11. The device of claim 7 wherein the first conductive layer and the second conductive layer have a first dimension in a first direction and each first contact has a second dimension in the first direction, the second dimension being smaller than the first dimension.

12. A method, comprising:
coupling a plurality of first contacts to an integrated circuit that extends into a substrate from a first surface of the substrate;
forming a first conductive layer on a second surface of the substrate after coupling the plurality of first contacts to the integrated circuit, the first conductive layer having a first portion and a second portion that consists of the single metal, the first portion including a combination of the single metal of the second portion and a material of the substrate and having a homogenous aggregate of first and second silicide-like compounds each having a stoichiometric ratio different from each other and consisting essentially of NiSi as a majority quantity and $Ni_2Si$ as a minority quantity and being insoluble to each other and coexisting in the solid phase;
forming a second conductive layer on the second portion of the first conductive layer;
forming the first portion and the second portion of the first conductive layer having a contact resistivity that is above $1\times10^{-5.4}$ and less than $1\times10^{-4.3}$ ohms*cm²; and
forming the substrate to have a resistivity between 3.5 and 18.0 mohms*cm.

13. The method of claim 12 wherein the single metal of the second portion is nickel.

14. The method of claim 12 wherein forming the second conductive layer includes depositing gold.

15. The method of claim 12 wherein forming the first conductive layer includes:
depositing a layer of the single metal on the second surface of the substrate; and
forming the first portion of the first conductive layer by converting some of the layer of the single metal into the silicide of the single metal.

16. The method of claim 15 wherein converting some of the layer of the single metal into the silicide of the single metal includes thermally annealing the layer of the single metal.

17. The method of claim 16 wherein the thermally annealing includes thermally annealing the layer of the single metal at a temperature less than 400° C.

18. The method of claim 17 wherein the thermally annealing includes thermally annealing the layer of the single metal at a temperature of about 200° C. for a period of about 10 seconds.

19. The method of claim 12, further comprising:
heating the substrate by subjecting the second surface of the substrate to ionic sputtering using ions of inert gas prior to the depositing the layer of the single metal on the second surface of the substrate, the ionic sputtering causing a temperature of the substrate to increase to a level at which at least some of the metal in the first conductive layer combines with silicon of the substrate to form the first portion of the first conductive layer.

* * * * *